United States Patent
Davis

(10) Patent No.: US 8,017,297 B1
(45) Date of Patent: Sep. 13, 2011

(54) IMAGE TRANSFER BY SUBLIMATION TO POWDER COATED ARTICLES

(75) Inventor: Joseph Dale Davis, Danville, IL (US)

(73) Assignee: Custom Signs on Metal LLC, Tilton, IL (US)

( * ) Notice: Subject to any disclaimer, the term of this patent is extended or adjusted under 35 U.S.C. 154(b) by 262 days.

(21) Appl. No.: 12/033,945

(22) Filed: Feb. 20, 2008

Related U.S. Application Data

(60) Provisional application No. 60/953,961, filed on Aug. 3, 2007.

(51) Int. Cl.
   *G03F 7/00* (2006.01)
   *B44C 1/17* (2006.01)
   *B05D 5/00* (2006.01)

(52) U.S. Cl. .......... 430/270.1; 430/273.1; 430/200; 430/330; 156/230; 156/240; 427/256; 427/287

(58) Field of Classification Search ........ 430/270.1, 430/273.1, 200, 330; 156/230, 240; 427/256, 427/287
See application file for complete search history.

(56) References Cited

U.S. PATENT DOCUMENTS

| | | | |
|---|---|---|---|
| 4,144,808 A | 3/1979 | Iwasa et al. | |
| 4,201,821 A | 5/1980 | Fromson et al. | |
| 4,395,263 A | 7/1983 | Davis | |
| 4,853,276 A | 8/1989 | Kurushima | |
| 4,997,506 A | 3/1991 | Recher et al. | |
| 5,034,244 A | 7/1991 | Berrer et al. | |
| 5,182,056 A | 1/1993 | Spence et al. | |
| 5,580,410 A * | 12/1996 | Johnston | 156/240 |
| 5,956,067 A | 9/1999 | Isono et al. | |
| 5,962,368 A | 10/1999 | Poole | |
| 5,976,296 A * | 11/1999 | Sherman et al. | 156/230 |
| 6,591,583 B2 | 7/2003 | Dickey et al. | |
| 7,022,202 B2 * | 4/2006 | Goertzen | 156/232 |
| 2003/0005568 A1 | 1/2003 | Davidson et al. | |
| 2005/0287306 A1 * | 12/2005 | Hays et al. | 427/458 |
| 2006/0172069 A1 * | 8/2006 | Vega et al. | 427/256 |

FOREIGN PATENT DOCUMENTS

| | | |
|---|---|---|
| CN | 1715081 | 1/2006 |
| EP | 0810102 | 12/1997 |
| JP | 2001030638 | 2/2001 |

\* cited by examiner

*Primary Examiner* — Amanda C. Walke
(74) *Attorney, Agent, or Firm* — Philip Lane

(57) ABSTRACT

Imaged articles and methods for producing imaged articles in which an image has been transferred by dye sublimations techniques to a powder coated substrate are described. The powder coated substrates may include various metals or alloys. The powder coated substrate may include a white powder coating layer and an over cured clear coat layer. The imaged article may be subsequently formed into desired three-dimensional shapes without significant loss in image quality or image degradation.

11 Claims, 2 Drawing Sheets

IMAGE TRANSFER BY SUBLIMATION TO POWDER COATED ARTICLES

CROSS-REFERENCE TO RELATED APPLICATIONS

The present application is based on and claims priority to U.S. Provisional Patent Application No. 60/953,961, filed on Aug. 3, 2007, herein incorporated by reference in its entirety.

BRIEF SUMMARY OF THE INVENTION

Certain embodiments of the invention are directed to powder coated electrically conductive substrates that can be bent, shaped, pressed, or otherwise molded into three dimensionally shaped articles without significant deterioration, cracks, or breach in continuity of the image and methods for making the shapeable imaged powder coated article.

In some embodiments, the invention may include a method for transferring an image to a powder coated article comprising the steps of powder coating an electrically conductive article with a white powder coating, applying a clear coat powder coating over the white powder coating, and over curing the clear coat powder coating. Embodiments of the invention may also include an image ready, powder coated substrate having an electrically conductive substrate, a white powder coating layer, and an over cured clear coat layer. Still further, embodiments of the invention may include imaged articles in which an image has been transferred to the over cured clear coat layer of the image ready, powder coated substrate utilizing dye sublimation techniques. Additional embodiments of the invention may also include imaged articles that have been subsequently formed into desired three-dimensional shapes.

DETAILED DESCRIPTION OF THE INVENTION

Certain embodiments of the invention are directed to powder coated electrically conductive substrates that can be bent, shaped, pressed, or otherwise molded into three dimensionally shaped articles without significant deterioration, cracks, or breach in continuity of the image and methods for making the shapeable imaged powder coated article. Various embodiments of the present invention include methods for applying an image to an image ready, powder coated substrate by dye sublimation techniques. Embodiments of the invention may include image ready, powder coated substrates which can accept images by dye sublimation techniques, as well as various imaged articles which having an image on a powder coated substrate. The imaged articles may be subsequently formed in three dimensions without significant deterioration or failure of the integrity of the image. That is, upon shaping of the imaged article, the image does not exhibit significant cracking, breaks, or other discontinuities in the image.

Figure 1:
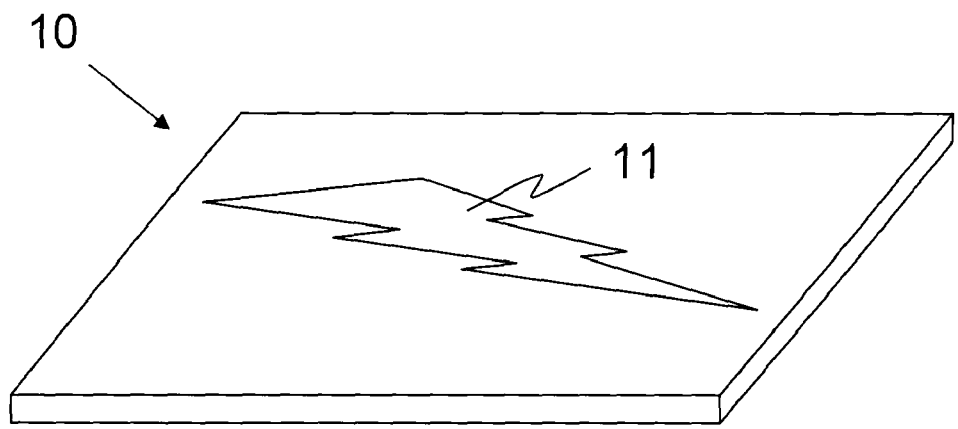
FIG. 1 is diagrammatic representation of an imaged article in accordance with an embodiment of the present invention.
Figure 2:
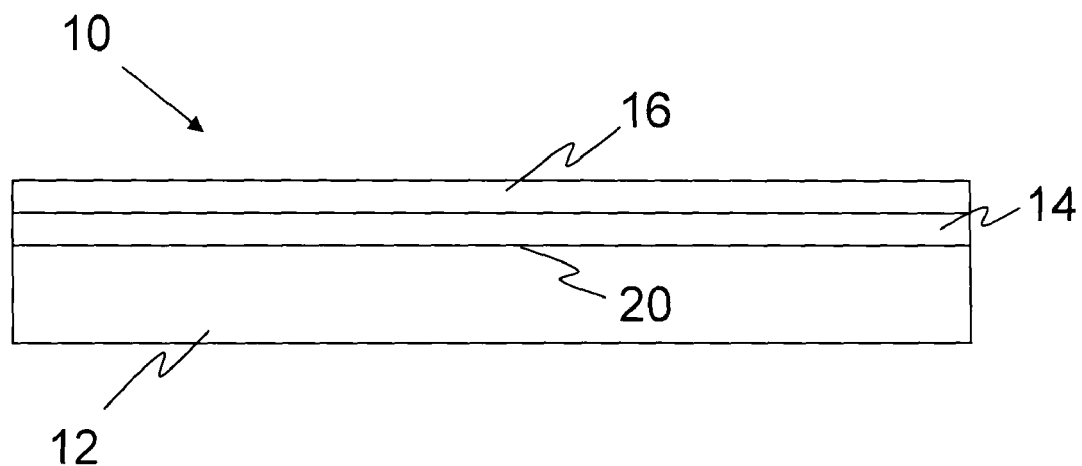
FIG. 2 is a cross-section representation of the imaged article of FIG. 1.

The process for preparing an imaged article that has an image on a powder coated substrate will be described with reference to FIGS. 1 and 2. FIG. 1 illustrates an imaged article 10 in accordance with an embodiment of the invention. As more clearly seen in FIG. 2, the imaged article 10 includes a substrate 12 with a white powder coated layer 14, and an over cured clear coat layer 16. The substrate 12 is an electrically conductive substrate suitable for use with powder coating techniques that, in certain embodiments, can withstand heating to about 400° F. without significant change in physical or chemical properties. In some embodiments, the substrate may include, but is not limited to, metals and alloys. The substrate may include, but is not limited to, mild steel, cold rolled steel, hot rolled steel, stainless steel, brass, nickel, nickel alloys, aluminum, aluminum alloys, copper, copper alloys, titanium, and titanium alloys. The thickness of the substrate is not particularly limited, but in many embodiments may range from about 26 gauge up to about ¼ of an inch.

Once the desired substrate is selected, the substrate may be cut or shaped to the desired shape or configuration. At this point, the substrate is substantially flat and planar. The substrate may be formed using standard cutting or shaping techniques known to those skilled in the art for the selected material. Metals and alloys, may be cut to size using a water jet, laser, plasma, shear cutting, punch techniques, or other mechanical mechanisms known to those skilled in the art for the cutting and manipulation of sheet materials. In the illustration shown in FIG. 1, the substrate has been cut in the form of a square. The size and shape of the substrate is not particularly limited and may include standard sizes corresponding to standard paper sizes, or may include any custom shapes and sizes.

The surface 20 of the substrate 12 is prepared for powder coating by removing any rust, scale, oil, or other contaminants from the surface 20. Any surface that is to receive the powder coating should be prepared using techniques suitable for the selected substrate material. For metal or alloy substrates, surfaces may be prepared by sand blasting, shot peening, or washing with appropriate cleaning solutions for the select material.

After the surface has been prepared, a white powder coating layer 14 is applied to the surface 20 of the substrate 12. In certain embodiments, the white powder coating layer 14 may be tinted towards different hues depending on the desired color, shade of white, or resulting effect on the image to be subsequently applied. The white powder coatings layer may be applied using an electrostatic gun and following standard powder coating techniques. The white powder coating may be made from standard powder coating materials and may include, but are not limited to, polyester resins, triglycidyl isocyanate polyesters, epoxy resins, epoxy/polyester hybrid resins, polyester urethane resins, and acrylic resins. Once the white powder coating layer 14 has been applied, the white powder coating layer is cured according to the specifications for the selected white powder coating material.

After the white powder coating layer 12 has cured and cooled, a clear coat powder coating is applied over the white powder coating layer 14. The clear coat powder coating layer may be applied using an electrostatic gun, following standard powder coating techniques. The clear coat powder coating may be made from a material including, but are not limited to, polyester resins, triglycidyl isocyanate polyesters, epoxy resins, epoxy/polyester hybrid resins, polyester urethane resins, and acrylic resins. In certain embodiments, the clear coat powder coating should be selected such that the cure temperature of the clear coat powder coating is near the temperature required for dye sublimation. In some embodiments, the cure temperature of the clear coat powder coating is within about 20° F. of the temperature required for dye sublimation. In other embodiments, the cure temperature of the clear coat powder coating is within about 10° F. of the temperature required for dye sublimation. In still other embodiments, the cure temperature of the clear coat powder coating is within about 5° F. of the temperature required for dye sublimation. For certain embodiments, the cure temperature of the clear coat powder coating may range from about 280° F. to about 450° F. In further embodiment, the cure temperature for the clear coat powder coating may range from about 350° F. to about 450° F. In still other embodiments, the cure temperature for the clear coat powder coating may range from about 380° F. to about 420° F., and in other embodiments at about 400° F.

Once the clear coat powder coating has been applied, the clear coat layer is over cured to provide an over cured, clear coat layer 16. Over curing the clear coat powder coating material typically involves heating the clear coat powder coating to a certain temperature for an extended time period beyond that required to initially cure the clear coat powder coating. The time period for initially curing the clear coat powder coating is that time (at a given temperature) required for the resin to harden and become durable. Generally, the manufacturer of the powder coating resin will provide initial cure times and temperatures for the resin.

The times and temperatures for over curing the clear coat powder coating will vary depending upon such variables as the material used for the clear coat powder coating, the thickness of the clear coat powder coating, the thickness of the substrate, the substrate material, and the white powder coating material. The clear coat powder coating is over cured to such that it is sufficiently hardened so the subsequently applied dye sublimation support will not stick or adhere to the over cured, clear coat layer during the dye sublimation process, and yet the over cured, clear coat layer is permeable or soft enough to accept the dye sublimation inks. The over cured, clear coat layer will exhibit an increase in hardness compared to a clear coat layer that has been initially cured. The time period required for over curing the clear coat powder coating to provide the over cured, clear coat layer 16 may be determined experimentally. For many embodiments, the time period required for over curing may range from about 10% to about 50% beyond the time required for initially curing the clear coat powder coating layer at the recommended cure temperature. Initially curing the clear coat powder coating means that time and temperature recommended by the manufacturer of the clear coat powder coating to acceptably cure the clear coat powder coating to provide a durable clear coat powder coating. Alternatively, in some embodiments, over curing may be achieved by heating the clear coat powder coating to temperatures above those required for initially curing the clear coat powder coating. In many embodiments, over curing may be detected by the appearance of a slight yellowing appearance to the applied clear coat and white powder coating layers.

Once the white powder coating layer 12 and the over cured clear coat layer 14 have been applied to the substrate, the resulting layered material is an image ready, powdered coated substrate that can accept images using standard dye sublimation image transfer techniques. The image ready, powder coated substrate may be prepared in any number of standard printing sizes as well as any custom shapes or sizes. Additionally, image ready, powder coated substrates may be stored for later applying an image using dye sublimation techniques.

Applying an image to the image ready, powder coated substrate generally involves using standard dye sublimation techniques. For example, the mirror image of the desired resulting image is printed on sublimation transfer medium. The medium may include, but is not limited to, sublimation transfer papers or image transfer heat shrink wrap. Sublimation ink cartridges with a standard office PC ink jet color printer, such as an Epson color printer may be utilized. The ink cartridges use an ink jet print head that disperses the inks in the sublimation transfer medium without using heat. The ink jet color printer typically has the ability to print images at 720 dpi or higher. Higher or lower resolution printing may be utilized. Large format ink jet printers allow for printing on large expanded printing areas. Electrostatic printers may also be used.

The sublimation transfer medium containing the printed image is place over the over cured, clear coat layer 16 of the image ready, powder coated substrate. Heat is then applied to the image ready, powder coated substrate such that the substrate material 12 is positioned between the heat source and the over cured, clear coat layer 16. In this embodiment heat is not applied directly to the dye sublimation transfer medium but is applied to the surface of the electrically conductive substrate and as the electrically conductive substrate is heated, heat is transferred to the white powder coating layer, the over cured clear coat layer, and then to the dye sublimation transfer medium. By heating in this manner, the over-cured clear coat layer will reach the desired temperature before or at about the same time as the dye sublimation transfer medium. Without intending to be bound by theory, it is believed that at the time the dyes are transferred to the over cured clear coat layer, substantially all of the over cured clear coat layer will be at a temperature sufficient to accept the dye sublimation ink.

Heat is applied to heat the image ready, powder coated substrate to temperature required for transfer of the image from the sublimation transfer medium to the over cured, clear coat layer 16 of the image ready, powder coated substrate. Without intending to be bound by theory, it is believed that by selecting a clear coat powder coating having a cure temperature which is near the temperature of the dye sublimation transfer allows for the resulting over cured, clear coat layer 16 to soften or become porous enough to accept the dyes from the sublimation process, yet remain hard enough or durable enough that the dye sublimation support does not stick to the over cured, clear coat layer. In certain embodiments, the temperature for the dye sublimation process (dye sublimation temperature) may range from about may range from about 280° F. to about 450° F. In further embodiment, the temperature may range from about 350° F. to about 450° F. In still other embodiments, the temperature may range from about 380° F. to about 420° F., and in additional embodiments, the temperature for the dye sublimation process may be about 400° F. After heating to the requisite temperature for the dye sublimation process, the sublimation transfer medium may be removed.

Heating the image ready, powdered coated substrate to a temperature sufficient to transfer the image from the sublimation transfer medium to the clear coat layer produces an imaged article 10. The imaged article 10 contains the image 11 on or within the over cured, clear coat layer 16 of the image ready, powdered coated substrate.

While the imaged article, which at this point is substantially planar, may be used for a variety of uses, such as signs, displays, structures and other similar uses, the imaged article may be subsequently shaped into more complex shapes without significant disruption of the applied image. Because it is difficult to apply an image to a complex shaped article, embodiments of the present invention provides a significant advantage in that the image may be applied to a planar substrate and subsequently shaped into the desired configuration effectively eliminating the difficulties involved in trying to apply an image to a complex shaped article.

Figure 3:
FIG. 3 is a diagrammatic representation of a shaped imaged article in accordance with an embodiment of the invention.
Figure 3:
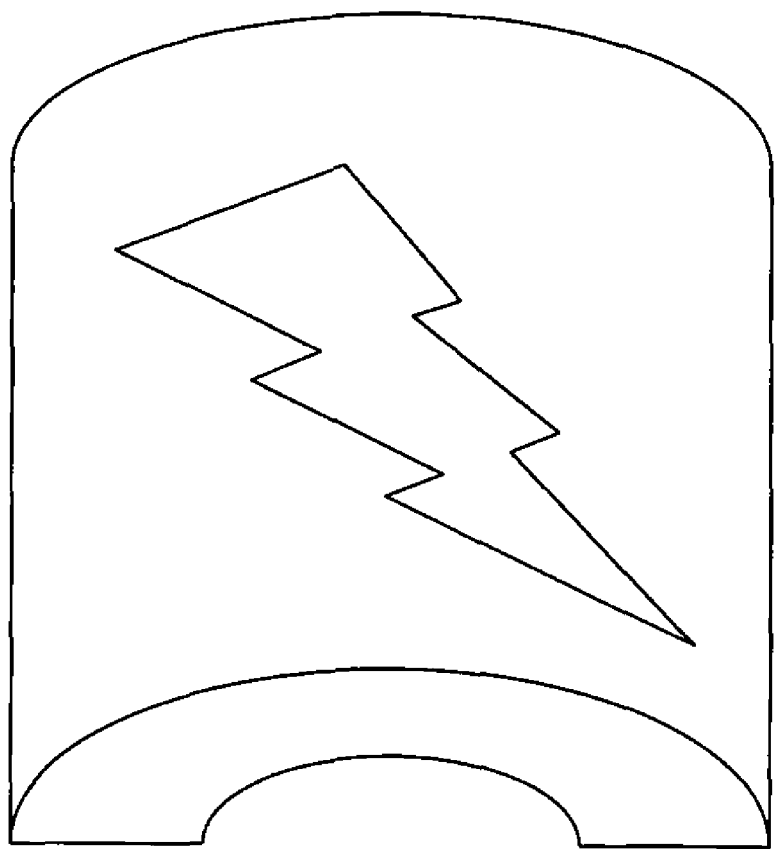

The imaged article may be bent, molded, or otherwise shaped into complex shapes by methods known to those skilled in the art for shaping metal. For example, an imaged article may be shaped into a body of a mail box, a vehicle bumper, a three-dimensional sign, appliance bodies, vehicle body panels, and other similar articles. FIG. 3 illustrates a shaped imaged article 30. While the shaping of the imaged article does not significantly deteriorate the image due to cracking or other similar breaches, care should be taken such that the tools used to shape the imaged article do not scratch or damage the over cured clear coat layer containing the image. Techniques for protecting a clear coat layer during shaping of the imaged article may include, but are not limited to using a protective layer between the shaping tool and the surface of the over cured clear coat layer. The imaged article may be subsequently formed or shaped into three dimensional shapes or configurations without significant deterioration, cracks, or breach in continuity of the image.

While many embodiment of the invention have been described above in detail, the invention has broad utility and is limited only by the appended claims.

What is claimed is:

1. A method for imaging an article, comprising the steps of:
   providing a substantially planar electrically conductive substrate, wherein the substrate can withstand heating to 400° F. without significant change of physical or chemical properties;
   applying a white powder coating layer to a surface of the electrically conductive substrate;
   applying a clear coat powder coating over the white powder coating layer, wherein the clear coat powder coating exhibits a cure temperature ranging from about 280° F. to about 450° F. and is within about 20° F. of the temperature for dye sublimation;
   heating the clear coat powder coating near the cure temperature for the clear coat powder coating for a time ranging from about 10% to about 50% beyond the time required for initially curing the clear coat powder coating to provide an over cured clear coat layer;
   positioning a dye sublimation transfer medium containing the image to be transfer over the over cured, clear coat layer;
   after positioning the dye sublimation transfer medium over the over cured, clear coat layer, applying heat to the electrically conductive substrate to a dye sublimation temperature ranging from about 280° F. to about 450° F. and for a time sufficient to transfer the image from the dye sublimation transfer medium to the over cured clear coat layer, wherein the electrically conductive substrate is positioned between the heat source and the over cured, clear coat layer to provide a substantially planar imaged article.

2. The method of claim 1, wherein the step of heating the electrically conductive substrate comprises heating to a dye sublimation temperature ranging from about 350° F. to about 450° F.

3. The method of claim 1, wherein the step of heating the electrically conductive substrate comprises heating to a dye sublimation temperature ranging from about 380° F. to about 420° F.

4. The method of claim 1, wherein the step of heating the electrically conductive substrate comprises heating to a dye sublimation temperature of about 400° F.

5. The method of claim 1, wherein the step of heating the electrically conductive substrate comprises heating to a dye sublimation temperature ranging from about 350° F. to about 450° F., and wherein the cure temperature for the clear coat powder coating is within 10° F. of the dye sublimation temperature.

6. The method of claim 1, wherein the step of heating the electrically conductive substrate comprises heating to a dye sublimation temperature ranging from about 350° F. to about 450° F., and wherein the cure temperature for the clear coat powder coating is within 5° F. of the dye sublimation temperature.

7. The method of claim 1, further comprising the step of shaping the substantially planar imaged article into a non-planar imaged article.

8. The method of claim 1, wherein the electrically conductive substrate is selected from the group consisting of a metal or an alloy.

9. The method of claim 1, wherein the electrically conductive substrate is selected from the group consisting of mild steel, cold rolled steel, hot rolled steel, stainless steel, brass, nickel, nickel alloys, aluminum, aluminum alloys, copper, copper alloys, titanium, and titanium alloys.

10. The method of claim 1, wherein the white powder coating layer is selected from the group consisting of polyester resins, triglycidyl isocyanate polyesters, epoxy resins, epoxy/polyester hybrid resins, polyester urethane resins, and acrylic resins.

11. The method of claim 1, wherein the clear coat powder coating is selected from the group consisting of polyester resins, triglycidyl isocyanate polyesters, epoxy resins, epoxy/polyester hybrid resins, polyester urethane resins, and acrylic resins.

* * * * *